United States Patent
Parker et al.

(10) Patent No.: US 11,971,575 B2
(45) Date of Patent: Apr. 30, 2024

(54) INTEGRATED BANDGAP TEMPERATURE SENSOR

(71) Applicant: OpenLight Photonics, Inc., Goleta, CA (US)

(72) Inventors: John Parker, Goleta, CA (US); Benjamin M. Curtin, Santa Barbara, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

(21) Appl. No.: 18/084,028

(22) Filed: Dec. 19, 2022

(65) Prior Publication Data

US 2023/0117058 A1   Apr. 20, 2023

Related U.S. Application Data

(63) Continuation of application No. 16/916,781, filed on Jun. 30, 2020, now Pat. No. 11,536,899.

(51) Int. Cl.
  *G02B 6/12*  (2006.01)
  *G02B 6/122*  (2006.01)

(52) U.S. Cl.
  CPC .... *G02B 6/1225* (2013.01); *G02B 2006/1213* (2013.01); *G02B 2006/12138* (2013.01)

(58) Field of Classification Search
  CPC .......... G02B 6/1225; G02B 2006/1213; G02B 2006/12138
  USPC ............................................. 385/1–3, 12, 14
  See application file for complete search history.

(56) References Cited

U.S. PATENT DOCUMENTS

| 5,154,514 | A | 10/1992 | Gambino et al. |
| 6,498,878 | B1 * | 12/2002 | Ueda ................... G02B 6/12033 385/24 |
| 10,002,863 | B2 | 6/2018 | Tomita et al. |
| 10,897,119 | B1 | 1/2021 | Kurczveil et al. |
| 11,536,899 | B2 | 12/2022 | Parker et al. |
| 2010/0084958 | A1 | 4/2010 | Shih et al. |
| 2011/0013668 | A1 | 1/2011 | Pacha et al. |
| 2012/0057815 | A1 | 3/2012 | Ezaki et al. |

(Continued)

FOREIGN PATENT DOCUMENTS

| CN | 113865732 A | 12/2021 |
| WO | WO-9219014 A1 | 10/1992 |

OTHER PUBLICATIONS

"U.S. Appl. No. 16/916,781, Non Final Office Action dated Mar. 17, 2022", 18 pgs.

(Continued)

*Primary Examiner* — Robert Tavlykaev
(74) *Attorney, Agent, or Firm* — Schwegman Lundberg & Woessner, P.A.

(57) ABSTRACT

Absolute temperature measurements of integrated photonic devices can be accomplished with integrated bandgap temperature sensors located adjacent the photonic devices. In various embodiments, the temperature of the active region within a diode structure of a photonic device is measured with an integrated bandgap temperature sensor that includes one or more diode junctions either in the semiconductor device layer beneath the active region or laterally adjacent to the photonic device, or in a diode structure formed above the semiconductor device layer and adjacent the diode structure of the photonic device.

20 Claims, 9 Drawing Sheets

(56) References Cited

U.S. PATENT DOCUMENTS

| | | | |
|---|---|---|---|
| 2015/0177458 A1* | 6/2015 | Bowers | G02B 6/131 |
| | | | 438/455 |
| 2016/0197064 A1 | 7/2016 | Bouvier et al. | |
| 2016/0336708 A1 | 11/2016 | Liang | |
| 2017/0045689 A1 | 2/2017 | Zhang et al. | |
| 2017/0131613 A1 | 5/2017 | Saeedi et al. | |
| 2017/0315424 A1 | 11/2017 | Celo et al. | |
| 2017/0343498 A1 | 11/2017 | Kalnitsky et al. | |
| 2018/0252594 A1 | 9/2018 | Jenkner et al. | |
| 2018/0254265 A1 | 9/2018 | Seif et al. | |
| 2019/0129097 A1 | 5/2019 | Liu et al. | |
| 2019/0326403 A1 | 10/2019 | Pillarisetty et al. | |
| 2020/0209655 A1* | 7/2020 | Roth | G02F 1/01708 |
| 2021/0119710 A1* | 4/2021 | Sakib | H04B 10/614 |
| 2021/0164845 A1 | 6/2021 | Liu et al. | |
| 2021/0405291 A1 | 12/2021 | Parker et al. | |
| 2023/0251419 A1* | 8/2023 | Zilkie | G02B 6/136 |
| | | | 385/14 |

OTHER PUBLICATIONS

"U.S. Appl. No. 16/916,781, Notice of Allowance dated Aug. 22, 2022", 13 pgs.

"U.S. Appl. No. 16/916,781, Response filed Jul. 18, 2022 to Non Final Office Action dated Mar. 17, 2022", 8 pgs.

"European Application Serial No. 20197229.6, Extended European Search Report dated Apr. 6, 2021", 8 pgs.

"European Application Serial No. 20197229.6, Communication Pursuant to Article 94(3) EPC dated Nov. 27, 2023", 5 pgs.

* cited by examiner

INTEGRATED BANDGAP TEMPERATURE SENSOR

PRIORITY

This application is a continuation of U.S. patent application Ser. No. 16/916,781, filed Jun. 30, 2020, which is incorporated by reference herein in its entirety.

TECHNICAL FIELD

This disclosure relates to temperature measurement in photonic integrated circuits (PICs), and more particularly to integrated bandgap temperature sensors and methods for their fabrication and use.

BACKGROUND

Integrated photonic devices, such as lasers, semiconductor optical amplifiers (SOA), modulators, and filters, tend to be highly sensitive to operating temperature, especially when implemented in silicon-based (e.g., silicon/III-V heterogeneous) material platforms. Therefore, PICs often provide some form of thermal management for temperature-sensitive devices. For example, feedback-controlled integrated heaters or coolers may be employed to actively adjust the temperature of photonic devices. Alternatively, device settings and parameters (e.g., voltages to induce phase shifts) may be controlled or adjusted in a manner that compensates for temperature fluctuations. Either case relies on accurate knowledge of the temperature. Due to high variation in power density across the die, however, PICs are often subject to widely varying thermal gradients, rendering temperatures measured adjacent to the PIC or from the backside of the PIC substrate insufficiently accurate. This problem is exacerbated as the functional density of PICs grows, e.g., due to an increasing number of optical lanes per PIC, entailing higher power densities and larger thermal gradients. Accordingly, temperature measurements are preferably performed by integrated sensors in close proximity to the photonic devices to be monitored. Conventionally used types of integrated temperature sensors, such as resistive temperature devices (RTD) or thin-film thermistors, however, measure only relative temperature, unless individually calibrated at two temperatures. It is desirable for an integrated sensor to, instead, provide an absolute temperature measurement while avoiding the high-cost calibration of each individual part.

BRIEF DESCRIPTION OF THE DRAWINGS

In the following description of embodiments of the disclosed subject matter, reference is made to the accompanying drawings.

DESCRIPTION

Figure 1A:
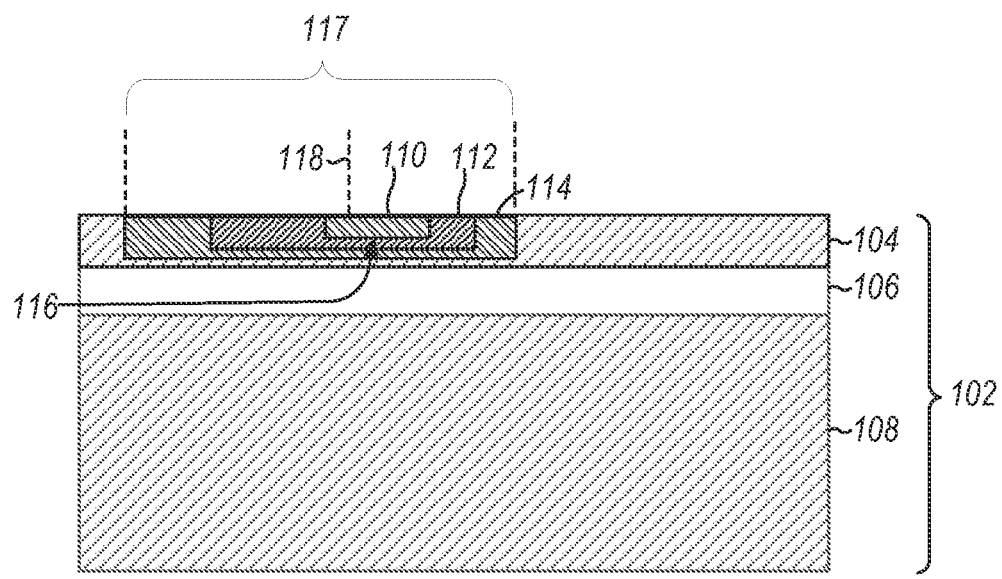
FIGS. 1A and 1B are schematic cross-sectional views of an example bandgap temperature sensor with a vertical diode junction in the silicon device layer of a PIC, in accordance with one embodiment, at two different stages during fabrication.

Described herein are various bandgap temperature sensor structures integrated in a PIC adjacent a photonic device to be monitored, as well as associated methods of fabrication, calibration, and operation of the integrated bandgap temperature sensors. A sensor is herein deemed "adjacent" a photonic device if it is located near the device, whether below (or above) or laterally next to the device, and closer to the photonic device it monitors than to other photonic devices within the PIC. In some embodiments, the temperature sensor is located at a distance of less than 100 □m or, preferably, less than 25 □m from the monitored photonic device (or, more particularly, the specific region within the photonic device whose temperature is to be measured)—sufficiently close to the photonic device for the temperature at the sensor location to deviate from the relevant photonic device temperature by no more than 10° C. For sensors located beneath the photonic device, the distance to the region to be monitored may even be less than 1 □m (e.g., about 0.5 □m), resulting in a temperature difference between the device and sensor locations of less than 1° C.

A bandgap temperature sensor, in general, includes a diode, and takes advantage of the fact that the voltage across the diode junction is proportional to the absolute temperature (measured in Kelvin) for any given electrical current through the diode; the proportionality constant can be determined during sensor calibration by measuring the voltage across the diode for the given current at a known temperature, and can subsequently be used to convert a measured voltage into the absolute temperature. Voltage measurements across two diodes can further be combined to eliminate the temperature dependence on the current. Beneficially, part-to-part variability between integrated bandgap temperature sensors of a given design affects the temperature measurements within margins that are acceptable for many applications, in contrast to, e.g., RTDs, where part-to-part variations in resistance typically render the RTDs unsuited for absolute-temperature measurements unless each part is individually calibrated, which may be prohibitively costly. Accordingly, it is possible to calibrate an integrated bandgap temperature sensor design once, and then use the calibrated parameters (e.g., the proportionality constant between temperature and junction voltage) for all parts sharing the same design.

While bandgap temperature sensors have long been employed in electronic integrated circuits (ICs), their implementation in PICs is challenging. In electronic ICs, the diode structures of the bandgap temperature sensor are generally created by doping the silicon layer. Doping in PICs, however, can cause significant optical losses in light-guiding regions—a problem that simply does not exist for electronic ICs. In addition, active photonic devices, for which accurate temperature measurements are especially important, usually increase the PIC complexity by adding bonded III-V device structures, associated metal connections, and the like, which takes up real estate on the substrate and may render access to any temperature sensor diode structure difficult. The III-V diodes used in the photonic devices themselves generally make poor bandgap temperature sensors, as they suffer added noise due to photogenerated carriers from on-chip light, and because the typically large number of layers and changing doping levels in the heterostructure of the diodes contributes to structural uncertainty that would undermine accurate absolute-temperature measurements.

Described below are various diode structures for bandgap temperature sensors that address these challenges, facilitating absolute temperature measurements in close proximity to photonic devices whose temperature is to be monitored. The described embodiments pertain, specifically, to temperature measurements of the active region in diode structures formed above the substrate (e.g., in a III-V die bonded to the substrate), as may be used in lasers, SOAs, optical modulators (e.g., electrooptic modulators or electro-absorption modulators), or other active photonic devices that are particularly sensitive to temperature variations. It should be understood, however, that variations of the disclosed bandgap temperature sensor structures may also be used to measure the temperature of other photonic components, including, e.g., passive devices such as silicon waveguides. For example, an arrayed waveguide grating (AWG) may benefit from accurate temperature measurements to compensate for temperature-induced changes in the wavelength response.

Further, the ensuing discussion focuses, for specificity, on PICs implemented with silicon-on-insulator (SOI) substrates and bonded III-V compound semiconductor materials (such as, e.g., indium phosphide (InP), indium arsenide (InAs), gallium arsenide (GaAs), aluminum arsenide (AlAs), gallium nitride (GaN), and/or indium antimonide (InSb)). As will be readily appreciated however, various material substitutions can be made without deviating from the inventive concepts. For example, instead of silicon, germanium or even compound semiconductors may be used for the device layer of the substrate. Further, for the bonded materials, II-VI compound semiconductors may be used in place of III-V materials.

In various embodiments, the diode structure for the bandgap temperature sensor is implemented in the silicon device layer of the substrate. The diode junction may, for example, be formed vertically between nested n-type and p-type doped wells located in a region adjacent the photonic device. Alternatively, a horizontal diode junction may be formed between two adjacent n-type and p-type regions directly underneath the photonic device diode. The latter approach brings the sensor in very close proximity to the region of the photonic device whose temperature is to be measured, e.g., usually, the active region within the intrinsic layer of the photonic device diode, where a "hot spot" may be created. At the same time, since the majority of the optical mode is located in the active region, doping of the silicon layer beneath does not cause any significant optical losses.

In various alternative embodiments, the diode structure of the bandgap temperature sensor is implemented in III-V material above the silicon device layer, and next to the photonic device diode. This can be done most straightforwardly by bonding two III-V die next to each other onto the SOI substrate, and patterning both die to create the photonic device diode in one and the temperature sensor diode in the other one. A more sophisticated, yet potentially less costly and more functional alternative is to provide a single III-V die with sufficient layers to create both the sensor diode and the photonic device diode, and pattern and etch that single die to create two diode structures that are horizontally separated as well encompass different ones of the layers.

The foregoing will be better understood from the following more detailed description of various example embodiments with reference to the accompanying drawings.

Figure 1B:
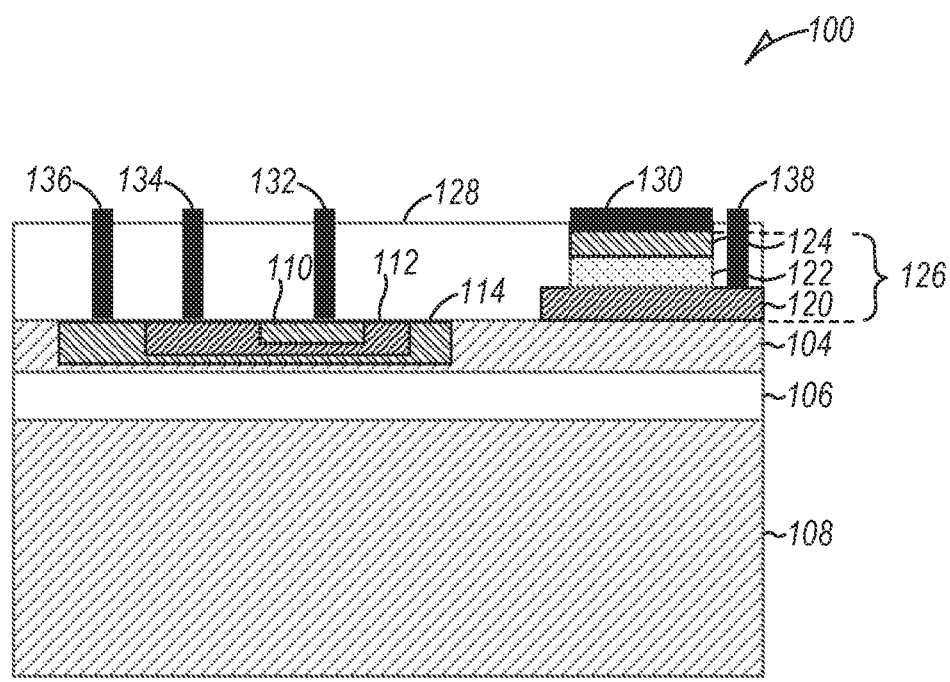

FIGS. 1A and 1B are schematic cross-sectional views of an example bandgap temperature sensor with a vertical diode junction in the silicon device layer of a PIC 100, in accordance with various embodiments, at two different stages during fabrication. The PIC 100 is formed on an SOI substrate 102 that includes a silicon device layer 104 on top of a buried oxide (BOX) or other insulating layer 106, which is, in turn, disposed on a substrate handle 108 (e.g., of silicon). As shown in FIG. 1A, a diode structure for the bandgap temperature sensor is formed in the silicon device layer 104, and includes three nested doped wells 110, 112, 114 alternating in the type of doping, e.g., as familiar from diode and transistor structures in electronic ICs. For example, the shallowest, innermost well 110 may be n-doped, the surrounding well 112 p-doped, and the deepest, outermost well 114 again n-doped, the wells 110, 112, 114 collectively forming an NPN transistor structure. Alternatively, the doping types can be reversed for a PNP transistor. Either way, the PN junction 116 formed between the interfaces of the wells 110, 112 may be used as the diode junction for the bandgap temperature sensor, with the outer well 114 providing electrical shielding (or, alternatively, being omitted). Collectively, the wells 110, 112, and optionally 114 form what is herein called the diode structure 117 of the bandgap temperature sensor.

The wells 110, 112, 114 can be created in the silicon device layer 104 by a series of well-known masking and ion-implantation steps, beginning with the creation of the outer well 114 and ending with the creation of the inner well 110. For each well, the area of the substrate that is not to be doped is masked (e.g., with silicon dioxide, photoresist, or some other suitable masking material); the depth of the well formed in the unmasked area is controlled by the implanted ion energy, and the doping concentration is controlled by the implant dose (ions/area).

Since the diode junction 116 of the bandgap temperature sensor is, in this embodiment, formed by doped regions generally arranged along a vertical direction (with the substrate 102 lying in a horizontal plane), as indicated by axis 118, and since the resulting junction 116 (formed at the interface between the wells 110, 112) has a vertical normal (meaning that the interface itself is horizontal, neglecting the small vertical interface portions around the rim of well 110), this diode junction 116 is herein also called a "vertical junction" (for ease of reference in contrast to the junction in the embodiment of FIGS. 2A-2D).

With reference to FIG. 1B, following creation of the diode structure 117 of the bandgap temperature sensor in the silicon device layer 104, a die of III-V material including, generally, multiple differently doped material layers in a vertical arrangement, can be bonded to the substrate 102, in a region adjacent the diode junction 116. The III-V die may, for example, include an n-type bottom layer 120, intrinsic middle layer 122 forming the active region where light will be manipulated, and p-type top layer 124; p-type bottom and n-type top layers are also possible instead. Also, each of the layers 120, 122, 124 may include multiple sub-layers that enable fine-tuning the characteristics of a device to be formed in the II-V die. The II-V die is patterned and etched, in some cases in multiple iterations, to form a diode structure 126 of a photonic device. As shown, the diode structure 126 may include a mesa comprising the intrinsic middle and top layers 122, 124 on top of a wider strip of the bottom layer 120. Although not shown, the photonic device may also include a silicon waveguide beneath the diode structure 126 of the photonic device, formed in the device layer 104 prior to bonding of the III-V die.

After formation of the diode structure 126 of the photonic device, the diode structure 126 and substrate 102 are usually covered in a dielectric cladding 128, following any device metallization, such as, e.g., deposition of a metal layer 130 on top of the diode mesa of the photonic device. Metal vias 132, 134, 136, 138 forming electrical connections for the diode structures 117, 126 of both the bandgap temperature sensor and the photonic device are then created. For example, the cladding 128 can be patterned and etched to create vertical channels to be filled with metal to form the metal vias 132, 134, 136, 138. Vias 132, 134 contacting the wells 110, 112 forming the diode junction 116 of the temperature sensor are, in use, connected to opposite terminals of a current source (further explained with respect to FIGS. 5A-5B); via 136 contacting the shielding outer well 114 may be connected, e.g., to ground. The metal layer 130 and via 138 contacting the top and bottom layers 124, 120 of the diode structure 126 of the photonic device may be connected to opposite terminals of bias and radio-frequency (RF) voltage sources, e.g., for signal generation, modulation, or amplification.

Figure 2A:
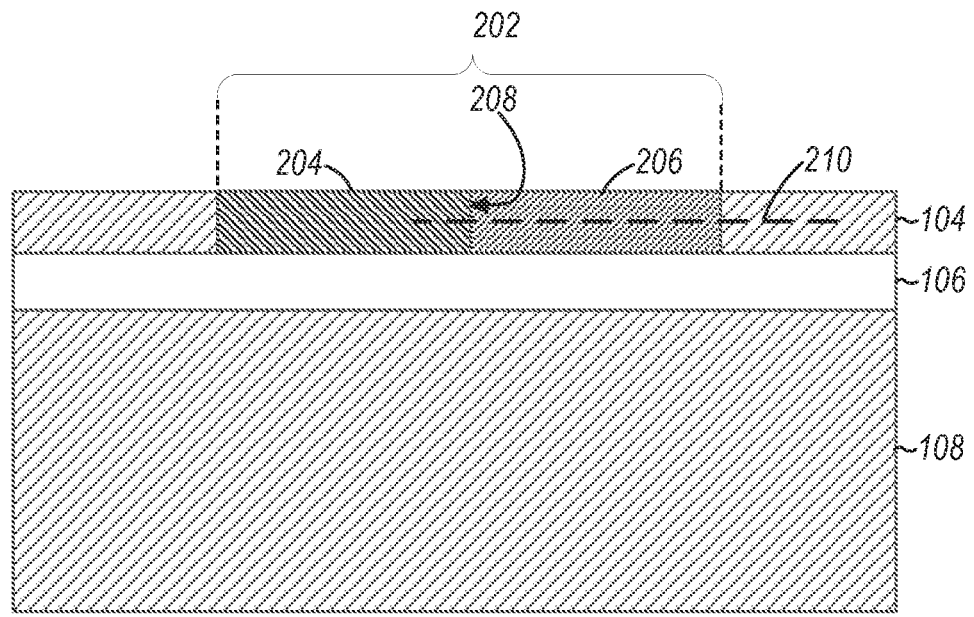
FIGS. 2A and 2B are schematic cross-sectional views of an example bandgap temperature sensor with a horizontal diode junction in the silicon device layer of a PIC, in accordance with various embodiments, at two different stages during fabrication.
Figure 2B:
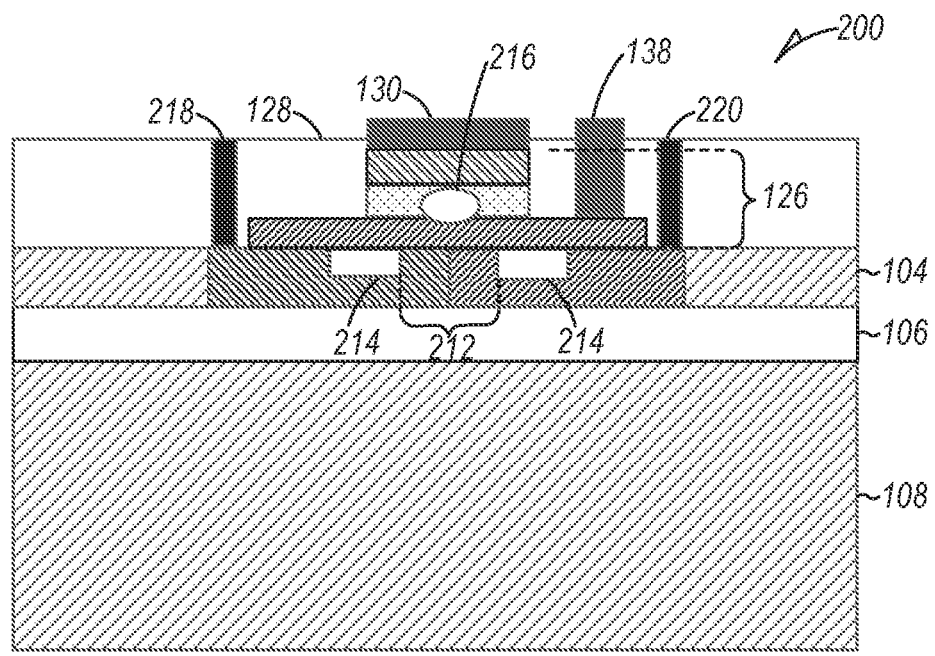

FIGS. 2A and 2B are schematic cross-sectional views of a bandgap temperature sensor with a horizontal diode junction in the silicon device layer of a PIC 200, in accordance with various embodiments, at two different stages during fabrication. First, as shown in FIG. 2A, a diode structure 202 for the bandgap temperature sensor is formed in the silicon device layer 104. Here, the diode structure 202 includes two horizontally adjacent doped regions 204, 206, one n-doped and one p-doped, that form, at the interface, a junction 208 whose normal 210 is oriented in the horizontal direction, parallel to the plane of the substrate 102. This diode junction 208 is therefore herein also called a "horizontal junction." The doped regions 204, 206 can be successively created by masking the silicon device layer 104 in areas not to be doped, followed by ion implantation.

With reference to FIG. 2B, once the horizontal diode junction 208 has been formed in the silicon device layer 104, the silicon device layer 104 is patterned to create a waveguide 212 in the doped regions 204, 206, oriented with its longitudinal axis (corresponding to the direction of light propagation) along the diode junction 208 (or, in other words, lying in the plane of the junction 208), such that the junction 208 is located inside the waveguide 212. As depicted, the waveguide 212 may be, e.g., a rib waveguide defined by partially etching the silicon device layer 104 to form two parallel trenches 214; these trenches 214 may then be filled with an oxide or other insulating material. Next, the diode structure 126 of the photonic device can be created within a III-V die bonded to the substrate 102, in a manner as described above with respect to FIG. 1B. Importantly, the photonic device diode structure 126 is formed directly above the waveguide 212 and, thus, above the diode junction 208 of the bandgap temperature sensor. Light propagating along the silicon waveguide 212 can couple into the III-V diode structure 126, where it is then modulated; or, conversely, light generated or amplified in the III-V diode structure 126 can couple into the silicon waveguide 212. The waveguide 212 and III-V diode structure may be configured such that the coupling happens largely preceding or following the active region of the diode structure 126 (understood to be the region across which a voltage is applied), such that, in the active region, the greater part of the optical mode 216 is in the III-V diode structure 126, with little if any optical intensity remaining in the waveguide 212 beneath. Therefore, the optical mode 216 does not interact in a substantial way with the horizontal diode junction 208 of the temperature sensor, alleviating concerns about optical losses. The electrical current and voltage applied to generate, amplify, or absorb the optical mode 216, e.g. generate light in a laser, tend to heat up the active region (primarily the intrinsic layer 122, but also the bottom layer 120), and monitoring the resulting hot spot is desirable. Beneficially, the horizontal diode junction 208 of the temperature sensor, located directly beneath the III-V diode structure, is in close proximity to the active region and, thus, the hot spot, allowing for very accurate temperature measurements. In some embodiments, the diode junction 208 of the temperature sensor is within 1 □m of the active region, and measures the absolute temperature in the active region with an accuracy of about 1° C.

After formation of the III-V diode structure 126 (with any metallization), a dielectric cladding 128 can be applied over the diode structure 126 and the substrate 102, and vias 138, 218, 220 for electrical connections are then created in the cladding 128. Vias 218, 220 contacting the p-doped and n-doped regions 204, 206 are placed to both sides of the waveguide 112 and III-V diode structure 126 of the photonic device. Connections for the III-V diode structure may be provided by a via 138 contacting the bottom layer 120 and a metal layer 130 on top of the top layer 124 of the diode structure 126.

Figure 2C:
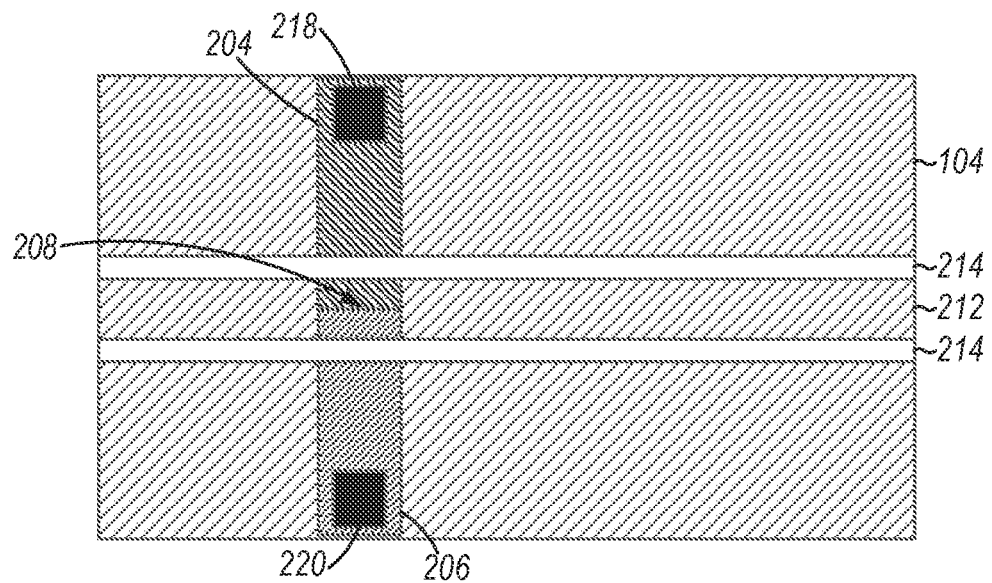
FIG. 2C is a schematic top-down view of an example bandgap temperature sensor including a horizontal diode junction as shown in FIGS. 2A-2B, in accordance with various embodiments.

FIG. 2C is a schematic top-down view of an example bandgap temperature sensor including a horizontal diode junction 208 as shown in FIGS. 2A-2B, in accordance with various embodiments. The horizontal direction in the figures corresponds to the longitudinal axis of the waveguide 212 (direction of light propagation). As can be seen, the doped regions 204, 206 of the diode structure 202 of the temperature sensor are arranged along an axis perpendicular to the waveguide 212, and the diode junction 208 is wholly inside the waveguide 212.

Figure 2D:
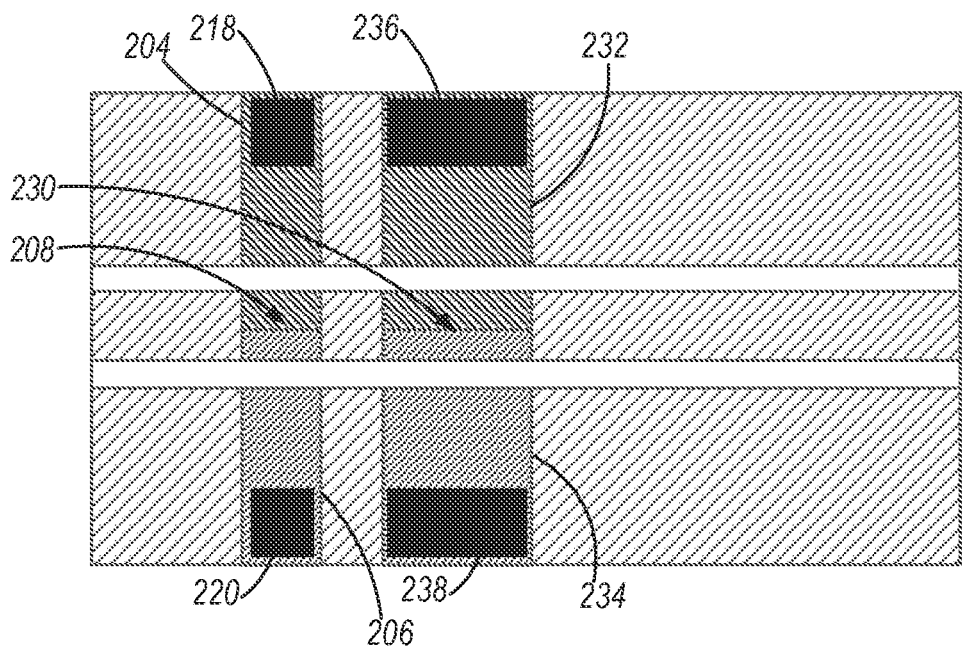
FIG. 2D is a schematic top-down view of an example bandgap temperature sensor including two horizontal diode junctions as shown in FIGS. 2A-2B, the two diode junctions having different junction areas, in accordance with various embodiments.

FIG. 2D is a schematic top-down view of an example bandgap temperature sensor including two horizontal diode junctions 208, 230 as shown in FIGS. 2A-2B, the two diode junctions 208, 230 having different junction areas, in accordance with various embodiments. The second diode junction 230 is formed between an additional pair of n-dope and p-doped regions 232, 234, which are contacted by an additional pair of vias 236, 238. In cross-sectional views, as in FIGS. 2A and 2B, the two junctions 208, 230 look the same, but one junction 230 extends farther along the waveguide 212 than the other junction 208, and has a greater junction area as a result. As explained with reference to FIG. 5B below, two diode junctions with different areas, if fed by equal constant currents, render the measured voltage difference independent of the current and solely dependent on the ratio between the junction areas, which can be defined by design and manufactured with high accuracy. Beneficially, therefore, bandgap temperature sensors with two diode junctions of different area provide for very accurate measurements.

Figure 3A:
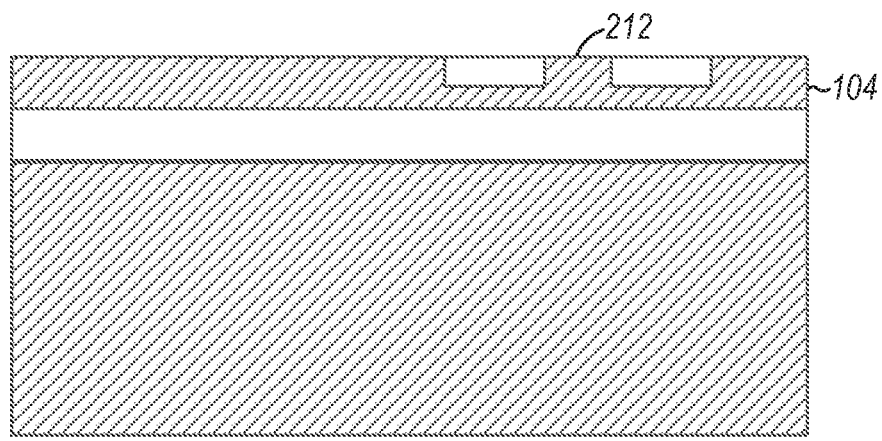
FIGS. 3A-3D are schematic cross-sectional views of an example bandgap temperature sensor formed along with the photonic device diode of the PIC from a single III-V die, in accordance with various embodiments, at various stages of fabrication.
Figure 3B:
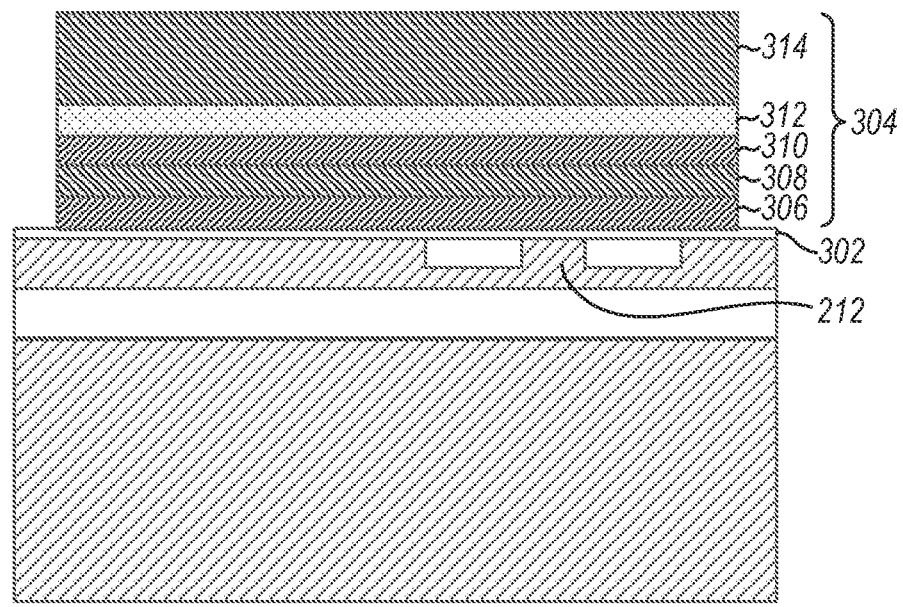

FIGS. 3A-3D are schematic cross-sectional views of an example bandgap temperature sensor formed along with the photonic device diode of a PIC 300 from a single III-V die, in accordance with various embodiments, at various stages of fabrication. The diode structures of both the photonic device and the bandgap temperature sensor are, in this case, created above the silicon device layer 104 in III-V materials. As shown in FIG. 3A, fabrication may begin with the creation of a waveguide 212 in the silicon device layer 104 of the substrate 102, e.g., in the same manner as described above with reference to FIG. 2B. The substrate 102 is then coated, as shown in FIG. 3B, with a thin layer of dielectric material 302, and a die 304 of III-V material is bonded to the coated substrate. The die 304 extends from an area above the silicon waveguide 212 to an adjacent area, where the bandgap temperature sensor will be formed, and includes a stack of five layers 306, 308, 310, 312, 314 that form multiple diode junctions. For example, the bottom layer 306 may be n-doped and the second layer thereabove may be p-doped, forming an NP diode junction 315 (indicated in FIG. 3C); the diode structure of the temperature sensor will be formed in these two layers 306, 308. Layers three through five may include, in this order, an n-type layer 310, an intrinsic layer 312, and a p-type layer 314; the diode structure of the photonic device will be formed in these three layers. (As will be appreciated, n-type and p-type doping may alternatively be swapped between the layers 306, 308, 310, 314.) Thus, the layers 310, 312, 314 may correspond to a conventionally used stack of epi layers for active photonic devices, augmented by the two bottom layers 306, 308 for the temperature sensor. The additional junction formed between the bottom two layers 306, 308 may be designed to have negligible absorption at the optical wavelengths used in the photonic device, so as to avoid added optical loss.

Figure 3C:
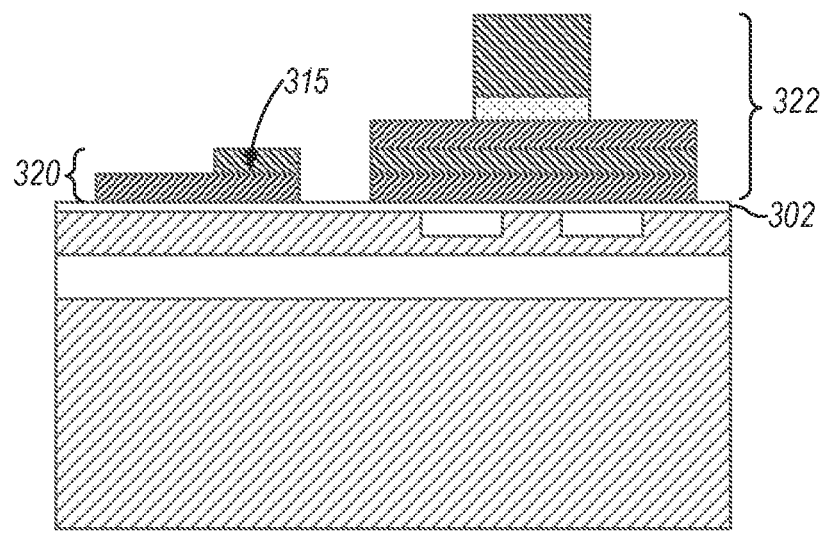

The III-V die 304 is patterned and etched in multiple steps to create separate diode structures 320, 322 for the bandgap temperature sensor and the photonic device, respectively. As can be seen in FIG. 3C, the two diode structures 320, 322 are horizontally separated by a full etch of the 304 die all the way down to the coated substrate. The thin dielectric layer 302 assists in bonding III-V to the SOI wafer beneath, and additionally serves to electrically isolate the diode structures 320, 322 from each other. For the diode structure 320 of the temperature sensor, the top three layers 310, 312, 314 are fully removed, and a portion of the second layer 308 is etched away to form a step-like structure exposing a portion of the bottom layer 306 to facilitate electrical connection; the diode junction 315 is formed between the first and second layers 306, 308. For the photonic device diode structure 322, a mesa is formed in the top two layers, and a broader strip of the bottom three layers is left underneath.

Figure 3D:
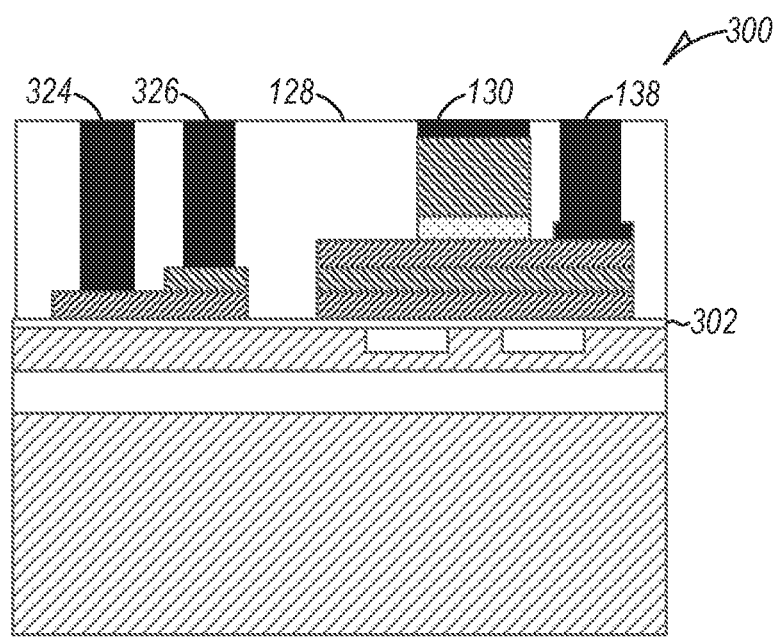

With reference to FIG. 3D, after formation of the diode structures 320, 322 from the III-V die 304, device metallization to form metal layer 130 on top of the diode mesa of structure 322, deposition of the cladding layer 128, and creation of the metal via 138 for the photonic device diode and the metal vias 324, 326 contacting the n-type and p-type layers of the diode structure 320 of the temperature sensor take place, substantially in the manner described with respect to the embodiments of FIGS. 1B and 2B, resulting in the PIC 300 as shown.

Figure 4A:
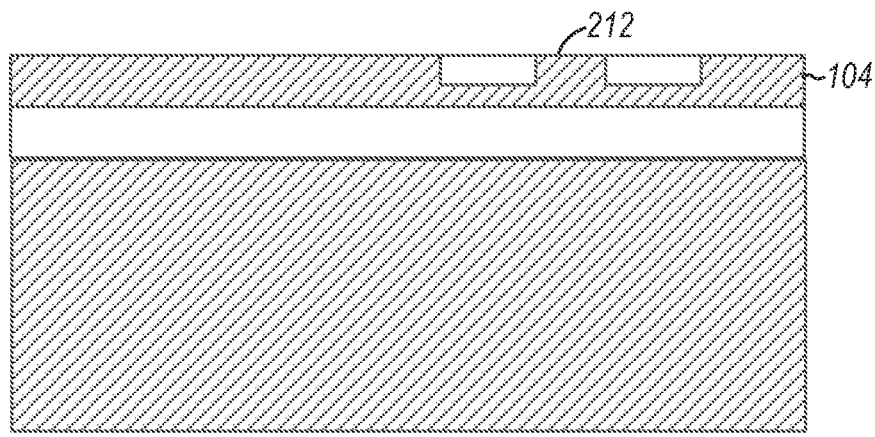
FIGS. 4A-4D are schematic cross-sectional views of an example bandgap temperature sensor formed from a III-V die separately from the photonic device diode of the PIC, in accordance with various embodiments, at various stages of fabrication.
Figure 4B:
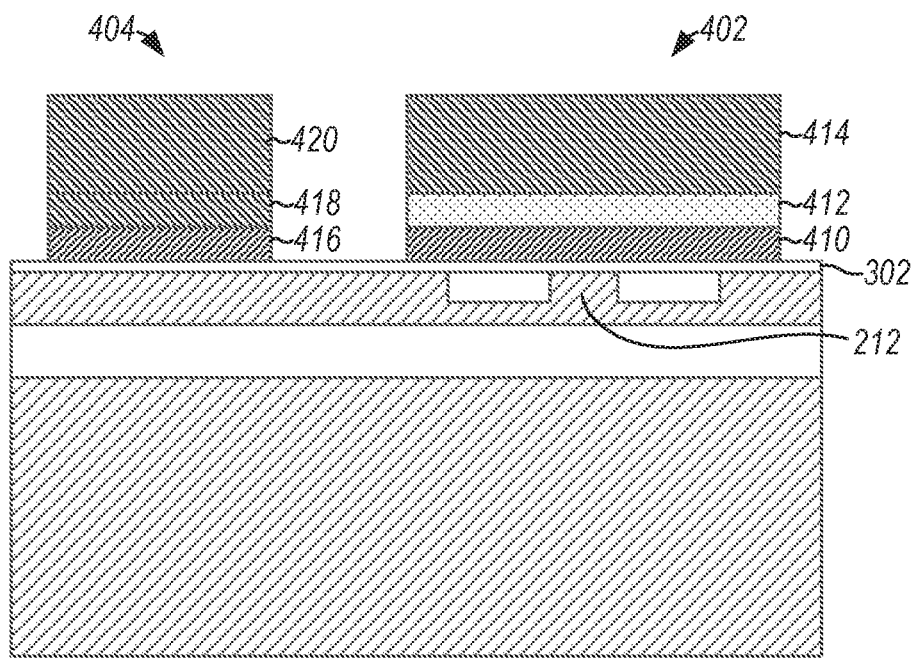
Figure 4C:
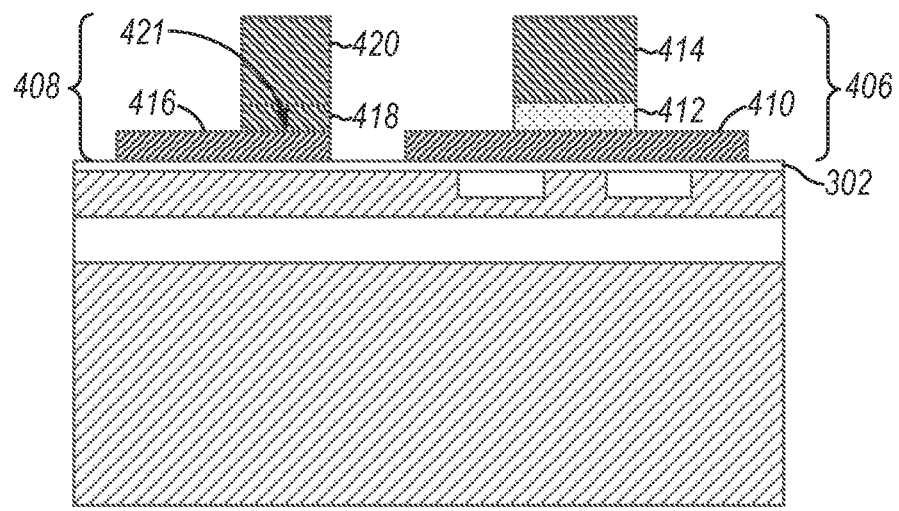

FIGS. 4A-4D are schematic cross-sectional views of an example bandgap temperature sensor formed from a compound semiconductor die separately from the photonic device diode of a PIC 400, in accordance with various embodiments, at various stages of fabrication. As shown in FIG. 4A, fabrication may begin with the creation of a waveguide 212 in the silicon device layer 104 of the substrate 102, e.g., in the same manner as described above with reference to FIGS. 2B and 3A. The substrate 102 is then coated, as shown in FIG. 4B, with a thin layer of dielectric material 302, and two separate die 402, 404 of III-V material are bonded adjacent one another (but with a gap therebetween rather than contiguously) to the coated substrate. One die 402 is disposed above the silicon waveguide 212, and serves to form the diode structure 406 of the photonic device (as shown in FIG. 4C); the other die 404 serves to form the diode structure 408 (as shown in FIG. 4C) of the temperature sensor. The die 402, 404 may be cut from different wafers and differ in their respective epi layer structures, which allows optimizing each for its respective use. The die 402 for the photonic device may include the usual doped (e.g., n-type) bottom layer 410, intrinsic layer 412, and doped (e.g., p-type) top layer 414, and may be structured, as shown in FIG. 4C to form a narrower mesa of the intrinsic and top layers 412, 414 above a wider strip of the bottom layer 410. The die 404 for the temperature sensor may include a doped (e.g., n-type) bottom layer 416, and oppositely doped (e.g., p-type) layers 418, 420 thereabove forming the diode junction 421, and may be patterned to create a narrower mesa of p-type layers 418, 420 (which may be of the same material) above a wider bottom strip of n-type layer 416. Beneficially, if the thicknesses and certain material properties (e.g., etch rates) are matched, the die 402, 404 can be co-processed, potentially reducing the total number of processing steps (as compared with sequential processing). Matching need not be exact. In practice, the layer 412 of the die 402 for the photonic device may include ten or more layers of slightly different materials (e.g., including quantum wells and barriers), and the layer 418 of the die 404, which may come to the same height as layer 412, may have only one material with an etch rate equal to the average for layer 412.

Figure 4D:
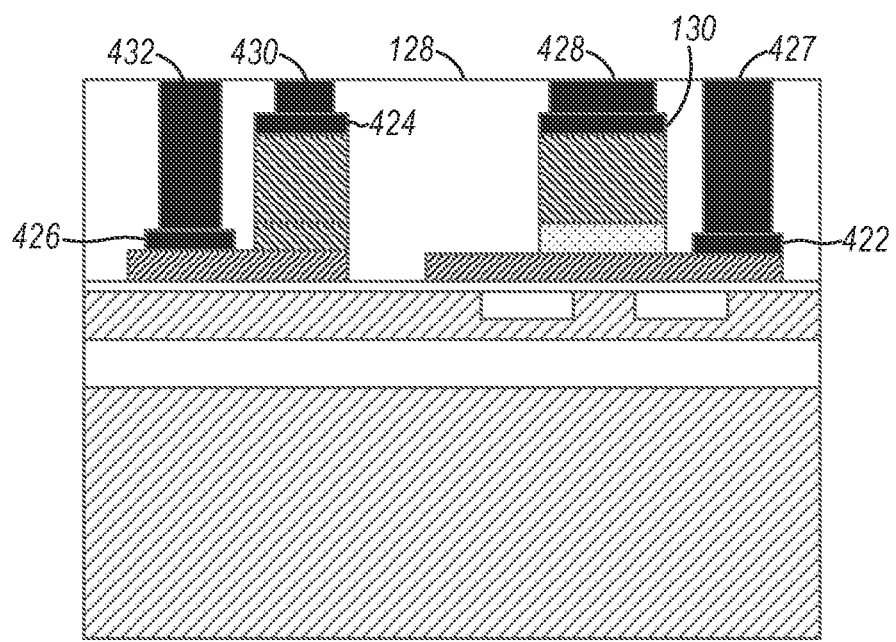

With reference to FIG. 4D, after formation of the III-V diode structures 406, 408 of the photonic device and the bandgap temperature sensor, the associated metal connections are formed in the cladding layer 128 deposited over the diode structures 406, 408 and substrate 102. In the depicted example, the metal connections include metal layers 130, 422 on both the top layer 414 and the bottom layer 410 of the photonic device diode structure 406, and similarly, metal layers 424, 426 on both the top layer 420 and the bottom layer 416 of the diode structure 408 of the temperature sensor. Further, vias 427, 428 contacting the metal layers 422, 130 in the photonic device diode 406, and vias 430, 432 contacting the metal layers 424, 426 in the diode structure 408 of the temperature sensor are formed. FIG. 4D shows the resulting structure in the PIC 400. (Note that variations in the metal connections between the various embodiments are not necessarily tied to the respective diode structures. For example, metal layers may also be included on the layers of the diode structure 320 in FIGS. 3C-3D, or may be omitted from the structures of FIG. 4D.)

Having described various structural embodiments of integrated bandgap temperature sensors, the operating principle and associated electrical circuitry for temperature measurements with such sensors will now be discussed.

Figure 5A:
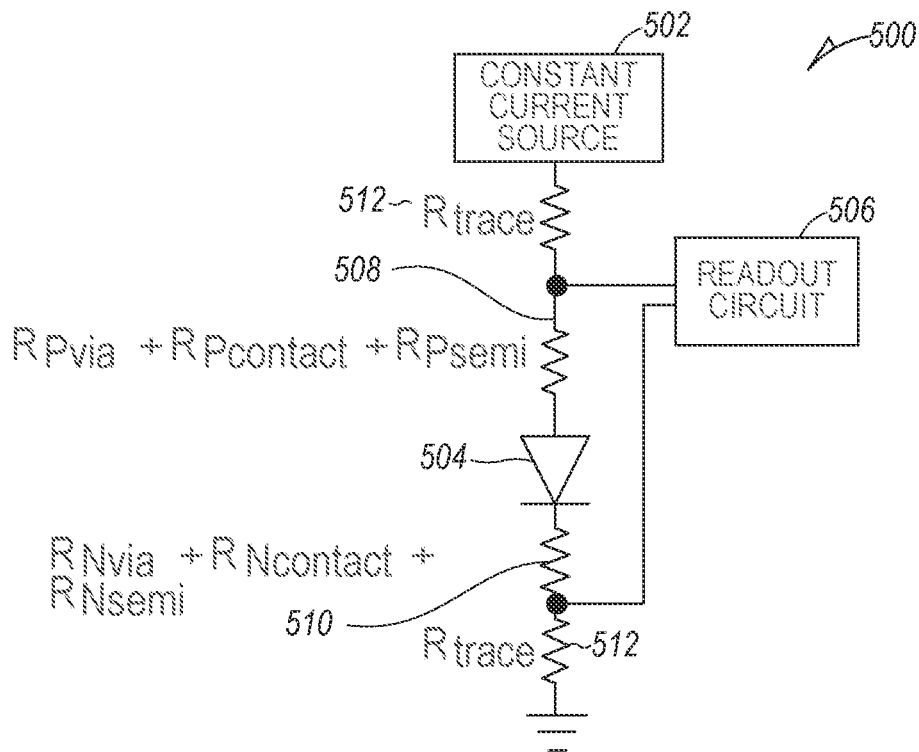
FIG. 5A is a simplified circuit diagram of an electrical circuit for operating bandgap temperature sensors, in accordance with various embodiments.

FIG. 5A is a simplified circuit diagram of an electrical circuit 500 for operating bandgap temperature sensors, in accordance with various embodiments. The circuit 500 includes a constant current source 502 to supply a constant current $I_{diode}$ to the diode 504 of the temperature sensor, and a readout circuit 506 to measure the resulting voltage $V_{diode}$ across the diode 504. In practice, the voltage measured by the readout circuit 506 includes, in addition to the voltage across the diode junction (e.g., implemented by any of diode junctions 116, 208, 315, 421), voltage drops over (inevitable) series resistances 508, 510 of the metal layers and vias contacting the p-type layers and n-type layers forming the diode junction ($R_{Pcontact}$, $R_{Ncontact}$, $R_{Pvia}$, $R_{Nvia}$) and of the doped p-type and n-type semiconductor layers themselves ($R_{Psemi}$, $R_{Nsemi}$), collectively total series resistance $R_s$. For an accurate diode readout, this series resistance $R_s$ is designed to be negligible (e.g., less than 1 $\Omega$). Note that the readout circuit 506 usually measures the voltage from via to via, and the measured voltage, therefore, does not include the voltage drop over the resistance 512 ($R_{trace}$) of the metal interconnects between the current source 502 and the diode vias. For the diode current $I_{diode}$, a low constant current near the diode turn-on voltage is usually chosen to provide a sufficient readout signal while causing negligible self-heating of the diode (with a corresponding negligible series resistance contribution). In some embodiments, the diode current $I_{diode}$ is between 0.1 mA and 1 mA.

The diode voltage $V_{diode}$ is given by the Shockley diode equation:

$$V_{diode} = T\frac{nK}{q}\ln\left(\frac{I_{diode}}{I_s} + 1\right) + R_S,$$

where $I_s$ is the reverse saturation current, n is the diode ideality factor, K is the Botzmann constant, q is the charge of an electron, and T is the temperature. If the series-resistance contribution is negligible (as it should be by design), the diode voltage reduces to:

$$V_{diode} = T\frac{nK}{q}\ln\left(\frac{I_{diode}}{I_s} + 1\right) = \frac{T}{T_{ref}}V_{diode\_at\_Tref}.$$

Herein, the factor $$\frac{nK}{q}\ln\left(\frac{I_{diode}}{I_s} + 1\right)$$

is a constant for constant diode current $I_{diode}$, and can be determined by measuring the diode voltage at a reference temperature $T_{ref}$, $V_{diode\_at\_Tref}$. This measurement need only be done once for a given design and fabrication process of the integrated temperature sensor (e.g., using a small sample of parts), and the determined reference temperature-to-voltage ratio $T_{ref}/V_{diode\_at\_Tref}$ can then be used as a calibration factor for all parts made by the same process to compute the temperature from the measured diode voltage:

$$T = \frac{T_{ref}}{V_{diode\_at\_Tref}}V_{diode}.$$

Figure 5B:
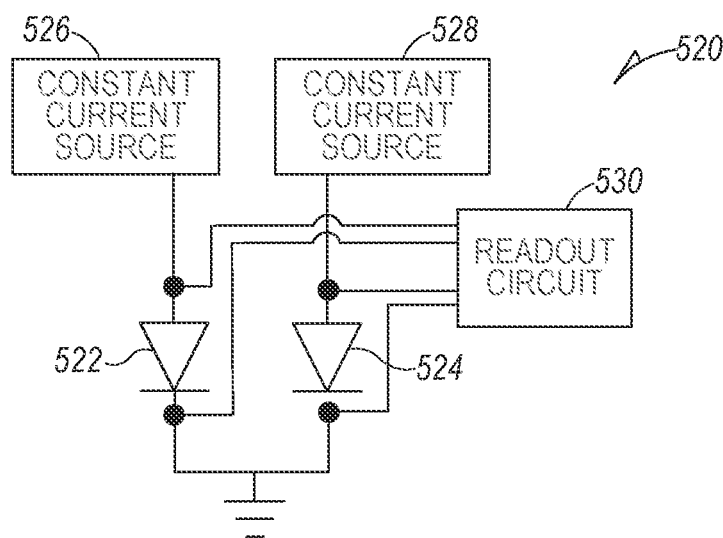
FIG. 5B is a simplified circuit diagram of an electrical circuit for operating bandgap temperature sensors with two diode junctions, in accordance with various embodiments.

FIG. 5B is a simplified circuit diagram of an electrical circuit 520 for operating bandgap temperature sensors with two diode junctions 522, 524, in accordance with various embodiments. In this case, two constant current sources 526, 528 are used to supply respective constant diode currents $I_{diode1}$ and $I_{diode2}$ (e.g., each in the range from 0.1 mA to 1 mA) to the diode junctions 522, 524, and a readout circuit 530 measures the differential voltage between the diode junctions 522, 524, that is, the difference between the diode voltages $V_{diode1}$ and $V_{diode2}$:

$$\Delta V_{diode} = V_{diode1} - V_{diode2} =$$
$$T\frac{nK}{q}\ln\left(\frac{I_{diode1}}{I_{s1}} + 1\right) - T\frac{nK}{q}\ln\left(\frac{I_{diode2}}{I_{s2}} + 1\right) + I_{diode1}R_{s1} - I_{diode1}R_{s2}.$$

Assuming that the difference between the voltage drops due to the series resistances $R_{s1}$ and $R_{s2}$ (not shown in FIG. 5B to simplify the illustration) is negligible, and further assuming that the diode currents $I_{diode1}$ and $I_{diode2}$ are much larger than the respective reverse saturation currents $I_{s1}$ and $I_{s2}$, the differential diode voltage reduces to:

$$\Delta V_{diode} = V_{diode1} - V_{diode2} = \frac{nKT}{q}\ln\left(\frac{\frac{I_{diode1}}{I_{s1}}}{\frac{I_{diode2}}{I_{s2}}}\right).$$

To achieve a negligible difference between the series resistances $R_{s1}$ and $R_{s2}$ on the two diodes 522, 524, the resistances of the vias and doped semiconductor layers may be designed to be small by using large vias and high material doping, and the metal layers contacting the diode may be designed to be small or equal in area such that their series resistances cancel out.

Two-diode bandgap temperature sensors may be conveniently implemented in the silicon-device layer, as illustrated in FIG. 2D. However, the other embodiments described herein can likewise be adapted to two-diode designs. For example, for temperature sensors implemented in III-V materials above the semiconductor device layer, two diodes may be formed adjacent one another by suitably patterning a single or two separate III-V die.

In some embodiments, the two diodes 522, 524 are supplied with equal currents, $I_{diode1}=I_{diode2}$, such that the current ratio drops out of the equation for the differential diode voltage. The reverse saturation current of a diode is proportional to the area of the diode junction. All else being equal between the two diodes 522, 524, therefore, the ratio of the reverse saturation currents $I_{s1}$ and $I_{s2}$ is equal to the ratio of their junction areas $A_{diode1}$ and $A_{diode2}$, which can be easily controlled by design. Accordingly, the differential diode voltage can be determined from:

$$\Delta V_{diode} = \frac{nKT}{q}\ln\left(\frac{A_{diode2}}{A_{diode1}}\right) = \frac{nKT}{q}\ln(N_{area}),$$

where $N_{area}$ is the ratio of the junction area of diode 2 to that of the junction area of diode 1. The temperature can now be determined from:

$$T = \frac{q}{NK\ln(N_{area})}\Delta V_{diode} = C\Delta V_{diode}.$$

The constant C may be measured once (by measuring a reference differential diode voltage $\Delta V_{diode\_at\_Tref}$ at a reference temperature $T_{ref}$ for one or a small number of sample parts) and then reused for all parts of a given design and fabrication process. Beneficially, since the constant C does not depend on the diode current, the diode current used during measurement may differ from that used during calibration.

In some embodiments, the two diodes 522, 524 are supplied with different constant currents $I_{diode1}$ and $I_{diode2}$, but have the same junction area $A_{diode1}=A_{diode2}$ and, thus, reverse saturation currents $I_{s1}=I_{s2}$. In this case, the differential diode voltage depends on the ratio of the diode currents:

$$\Delta V_{diode} = \frac{nKT}{q}\ln\left(\frac{I_{diode1}}{I_{diode2}}\right) = \frac{nKT}{q}\ln(N_{current}),$$

where $N_{current}$ is the ratio of the diode current $I_{diode1}$ to the diode current $I_{diode2}$. The temperature can now be determined from:

$$T = \frac{q}{NK\ln(N_{current})} = \Delta V_{diode} = C'\Delta V_{diode},$$

where the constant C' may be measured once (by measuring a reference differential diode voltage $\Delta V_{diode\_at\_Tref}$ at a reference temperature $T_{ref}$ for one or a small number of sample parts) and then reused for all parts of a given design and fabrication process, provided the same current ratio $N_{current}$ is used during calibration and subsequent measurements.

Figure 6:
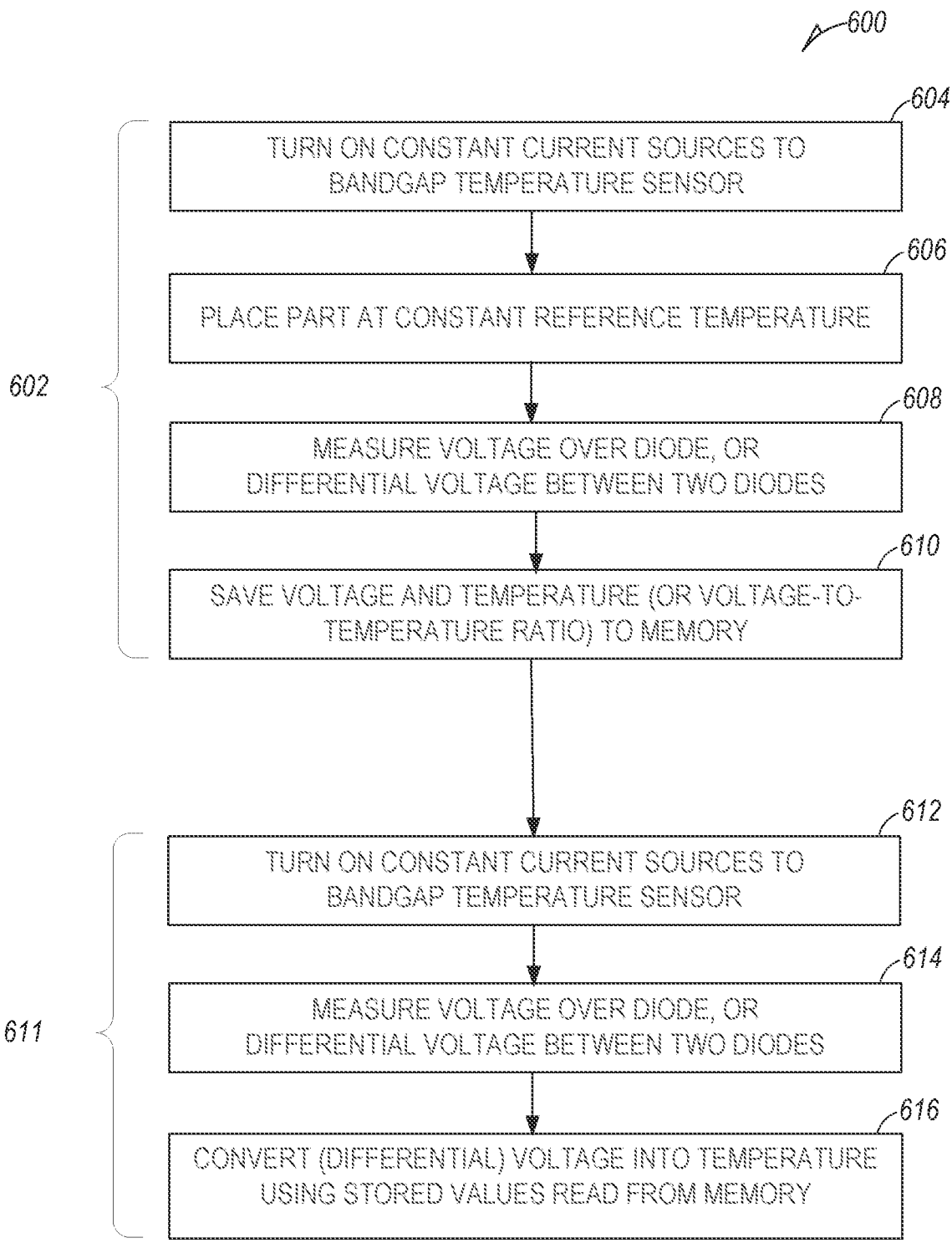
FIG. 6 is a flow chart of a method of calibrating and operating a bandgap temperature sensor, in accordance with various embodiments.

FIG. 6 is a flow chart of a method 600 of calibrating and operating a bandgap temperature sensor, in accordance with various embodiments. Calibration (602) may be done on one part, and the determined calibration factors may be stored and used for any part fabricated by the same process and according to the same design. A "part," in this context, refers to the PIC assembled with the planned assembly flow (such as, e.g., flip-chipped onto an organic substrate). Calibration (602) involves turning on the constant current source(s) (e.g., 502, 526, 528) to the diode(s) (e.g., 504, 522, 524) of the integrated bandgap temperature sensor (act 602) within the part; placing the part into an isothermal environment (e.g., an oven or dedicated testbed) at a constant reference temperature $T_{ref}$ (act 606); and then measuring the corresponding reference diode voltage $V_{diode\_at\_Tref}$ or, in two-diode embodiments, the reference differential diode voltage $\Delta V_{diode\_at\_Tref}$ at that temperature $T_{ref}$ (act 608), e.g., with readout circuit 506 or 530. The measured reference temperature and reference (differential) diode voltage, or their ratio (corresponding to the constants C or C' in the two-diode embodiments), can then, in act 610, be saved to memory (e.g., flash memory) and later to firmware or integrated memory on each part going through production (e.g., including PIC, electronic ICs, and memory flip-chipped onto an organic substrate), for look-up during subsequent use of the bandgap temperature sensor of the respective part.

To employ the calibrated temperature sensor (meaning, any part of a set of parts all sharing the same design and fabrication process) (611), the constant current source is turned on to supply the diode of the bandgap temperature sensor is turned on to supply the diode (act 612), and the resulting voltage across the diode is measured (e.g., using readout circuit 506 or 530) (act 614).

Based on the reference temperature-to-voltage ratio (or constant C or C') stored and looked up in memory, the measured diode voltage can then be converted to the temperature (act 616).

Various diode structures and electronic circuits for integrated bandgap temperature sensors have been described. The embodiments share the benefits of facilitating absolute temperature measurements in the vicinity of photonic devices without requiring part-by-part calibration, but present various trade-offs, e.g., between complexity, accuracy, and proximity to the desired monitored regions. A person of skill in the art will know how to select the embodiment best suited for the requirements of a specific application.

The bandgap temperature sensors with diode structures implemented in silicon (in the embodiments of PICs 100, 200 in FIGS. 1A-2D) avoid any modifications to the III-V layers of the PIC, which can entail cost savings, but relies on additional process steps for the silicon layer. In the case of a horizontal diode junction overlapping with the silicon waveguide of an active photonic device (in PIC 200), the diode junction of the temperature sensor can, advantageously, be located very close to the hot spot. The bandgap temperature sensors utilizing diode junctions implemented in III-V materials (in the embodiments of PICs 300, 400 in FIGS. 3A-4D) avoid the need to add silicon process steps, but at the cost of using additional III-V materials and, in the case of photonic device and sensor diodes formed from the same die (in PIC 300), modifying the III-V die structure. Bandgap temperature sensors formed in III-V die that are separate from the III-V die used for the photonic devices (in PIC 400) benefit from straightforward design and implementation, but cannot be placed as close to the photonic device as, for example, the single-die embodiment (in PIC 300). The former can read out the absolute temperature on the active surface of the photonic circuit, whereas the latter also enables reading out the junction temperature of the photonic device.

As between one-diode and two-diode embodiments, the former benefits from fewer diodes and current sources, which simplifies design, contributing to cost reduction. Achieving sufficiently low contact resistance to render the voltage drop due to series resistance negligible may, on the hand, render manufacturing somewhat more difficult. Further, the single-diode design relies on the same diode current to be used during calibration and operation; that is, the current value of the constant current source cannot be changed later on. In some embodiments, a calibration accuracy of 50° C.+/−5° C. can be achieved. With two-diode designs, calibration accuracies of 50° C.+/−1° C. are achievable. With diodes using different junction areas, but the same diode current, moreover, calibration and measurement may occur at different diode currents, as the temperature calibration depends only on the ratio of the junction areas, which is defined by device artwork on photolithography masks, and is stable across the process. In addition, with two diodes, due to the differential voltage measurement, a negligent voltage contribution due to the series resistance is not contingent on low contact resistance, but can also be achieved with using the same contact area for both diodes (such that the associated voltage drops cancel out).

The following numbered examples are illustrative embodiments.

1. A system comprising: a substrate comprising a semiconductor device layer; an integrated photonic device comprising a first diode structure formed above the semiconductor device layer; and an integrated temperature sensor comprising a second diode structure formed in or above the semiconductor device layer adjacent the first diode structure.
2. The system of example 1, wherein the second diode structure comprises two or more nested doped wells in the semiconductor device layer, the two or more nested doped wells forming a vertical diode junction in a region laterally adjacent the first diode structure.
3. The system of example 1, wherein the second diode structure comprises a pair of doped regions in the semiconductor device layer, the pair of doped regions forming a horizontal diode junction beneath the first diode structure.
4. The system of example 3, wherein the second diode structure comprises two pairs of doped regions in the semiconductor device layer, the two pairs of doped regions forming two horizontal diode junctions beneath the first diode structure.
5. The system of example 4, wherein the two horizontal diode junctions differ in area.
6. The system of any of examples 3-5, wherein the integrated photonic device comprises a waveguide formed beneath the first diode structure in the semiconductor device layer, and wherein the horizontal diode junction of the second diode structure is located in the waveguide.
7. The system of example 1, wherein the first and second diode structures are formed in a stack of doped semiconductor material disposed above the semiconductor device layer.
8. The system of example 7, wherein the stack of doped semiconductor material comprises, in this order from bottom to top, a doped first layer of a first type of doping, a doped second layer of a second type of doping, a doped third layer of the first type of doping, an intrinsic fourth layer, and a doped fifth layer of the second type of doping, wherein the first type of doping is one of n-type doping or p-type doping and the second type of doping is the other one of n-type doping or p-type doping.
9. The system of example 8, wherein the first diode structure is formed in the third, fourth, and fifth layers, and wherein the second diode structure is formed in the first and second layers.
10. The system of example 1, wherein the first diode structure is formed in a first stack of doped semiconductor material disposed above the semiconductor device layer and the second diode structure is formed in a second stack of doped semiconductor material disposed above the semiconductor device layer adjacent the first stack.
11. The system of any of examples 1-10, wherein the semiconductor device layer is a silicon device layer and the first diode structure comprises III-V compound semiconductor material.
12. The system of any of examples 1-11, wherein the bandgap temperature sensor further comprises an electronic circuit comprising a constant current source to supply a constant current to a diode of the second diode structure and a readout circuit to read out a voltage across the diode of the second diode structure.
13. The system of example 12, wherein the second diode structure comprises two diodes and the electronic circuit comprises two constant current sources to supply constant currents to the two diodes, the readout circuit to read out voltages across both of the two diodes.
14. The system of example 13, wherein the two diodes differ in diode junction area.
15. The system of example 13, wherein the supplied constant currents differ between the two diodes.
16. A method of manufacturing a photonic integrated circuit with an integrated bandgap temperatures sensor for measuring a temperature of an integrated photonic device, the method comprising: bonding, to a semiconductor substrate, a stack of doped semiconductor material comprising, in this order from bottom to top, a doped first layer of a first type of doping, a doped second layer of a second type of doping, a doped third layer of the first type of doping, an intrinsic fourth layer, and a doped fifth layer of the second type of doping, wherein the first type of doping is one of n-type doping or p-type doping and the second type of doping is the other one of n-type doping or p-type doping; patterning and etching the stack of doped semiconductor material to form: a first diode structure comprising a diode mesa formed in the fourth and fifth layers above a bottom strip formed in the first through third layers, and a second diode structure forming a diode junction between the first and second layers, the second diode structure being adjacent the first diode structure but not contiguous with the first diode structure; and creating metal connections to the third and fifth layers within the first diode structure and to the first and second layers within the second diode structure, wherein the first diode structure forms part of the photonic device and the second diode structure forms part of the bandgap temperature sensor.
17. The method of example 16, further comprising: prior to bonding the stack of doped semiconductor material to the substrate, patterning a semiconductor device layer of the substrate to create a waveguide of the photonic device in the semiconductor device layer, the first diode structure being formed above the waveguide.
18. The method of example 16, wherein the semiconductor device layer is a silicon device layer and the stack of doped semiconductor material comprises III-V compound semiconductor material.
19. A method of manufacturing a photonic integrated circuit with an integrated bandgap temperatures sensor for measuring a temperature of an integrated photonic device, the method comprising: creating, in a semiconductor device layer of a substrate, p-type and n-type doped regions forming a horizontal diode junction of the bandgap temperature sensor; patterning the semiconductor device layer to create a waveguide in a plane of the horizontal diode junction and overlapping with the horizontal diode junction; bonding a stack of doped semiconductor material to the substrate above the waveguide and the horizontal diode junction, the stack of doped semiconductor material comprising an intrinsic layer sandwiched between doped top and bottom layers; patterning and etching the stack of doped semiconductor material to form a diode structure of the photonic device; and creating metal connections to the n-type and p-type doped regions of the horizontal diode junction and to the top and bottom layers of the diode structure of the photonic device.
20. The method of example 19, wherein the semiconductor device layer is a silicon device layer and the stack of doped semiconductor material comprises III-V compound semiconductor material.

Although the inventive subject matter has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense.

What is claimed is:

1. A system comprising:
   a substrate comprising a semiconductor device layer;
   an integrated photonic device comprising a first diode structure formed above the semiconductor device layer; and
   an integrated temperature sensor comprising a second diode structure comprising a pair of doped regions in the semiconductor device layer, the pair of doped regions forming a horizontal diode junction beneath the first diode structure, the horizontal diode junction being located at a predetermined distance from the first diode structure to enable thermal coupling therebetween.

2. The system of claim 1, wherein the second diode structure comprises two pairs of doped regions in the semiconductor device layer, the two pairs of doped regions forming two horizontal diode junctions beneath the first diode structure.

3. The system of claim 2, wherein the two horizontal diode junctions differ in area.

4. The system of claim 1, wherein the integrated photonic device comprises a waveguide formed beneath the first diode structure in the semiconductor device layer, and wherein the horizontal diode junction of the second diode structure is located in the waveguide.

5. The system of claim 1, wherein the semiconductor device layer is a silicon device layer.

6. The system of claim 1, wherein the first diode structure comprises III-V compound semiconductor material.

7. The system of claim 1, wherein the integrated temperature sensor further comprises an electronic circuit comprising a constant current source to supply a constant current to a diode of the second diode structure and a readout circuit to read out a voltage across the diode of the second diode structure.

8. The system of claim 7, wherein the second diode structure comprises two diodes and the electronic circuit comprises two constant current sources to supply constant currents to the two diodes, the readout circuit to read out voltages across both of the two diodes.

9. The system of claim 8, wherein the two diodes differ in diode junction area.

10. The system of claim 8, wherein the supplied constant currents differ between the two diodes.

11. The system of claim 1, wherein the first diode structure is part of an active photonic device.

12. The system of claim 11, wherein the active photonic device is one of a semiconductor optical amplifier, an optical modulator, or a laser.

13. A method of manufacturing a photonic integrated circuit with an integrated bandgap temperature sensor for measuring a temperature of an integrated photonic device, the method comprising:
   creating, in a semiconductor device layer of a substrate, p-type and n-type doped regions forming a horizontal diode junction of the bandgap temperature sensor;
   patterning the semiconductor device layer to create a waveguide in a plane of the horizontal diode junction and overlapping with the horizontal diode junction;
   bonding a stack of doped semiconductor material to the substrate above the waveguide and the horizontal diode junction, the stack of doped semiconductor material comprising an intrinsic layer sandwiched between doped top and bottom layers;
   patterning and etching the stack of doped semiconductor material to form a diode structure of the photonic device; and
   creating metal connections to the n-type and p-type doped regions of the horizontal diode junction and to the top and bottom layers of the diode structure of the photonic device,
   the horizontal diode junction being located at a predetermined distance from the diode structure of the photonic device to enable thermal coupling therebetween.

14. The method of claim 13, wherein the semiconductor device layer is a silicon device layer, and wherein the stack of doped semiconductor material comprises III-V compound semiconductor material.

15. The method of claim 13, wherein the metal connections to the top and bottom layers of the diode structure of the photonic device are configured to apply a voltage across an active region directly above the horizontal diode junction.

16. The method of claim 15, wherein the waveguide and the diode structure of the photonic device are configured to such that, in operation, light couples between the waveguide and the diode structure of the photonic device preceding and following the active region.

17. The method of claim 15, wherein the horizontal diode junction is created within 1 mm of the active region.

18. A method comprising:
   applying an electrical voltage across an active region of a first diode structure of an integrated photonic device formed above a semiconductor device layer of a substrate;
   supplying a constant current to a second diode structure that includes a horizontal diode junction formed by a pair of doped regions located at a predetermined distance beneath the first diode structure in the semiconductor device layer to enable thermal coupling between the horizontal diode junction and the first diode structure, and measuring a temperature-dependent voltage across the horizontal diode junction of the second diode structure; and
   determining a temperature of the active region based on the measured voltage across the horizontal diode junction.

19. The method of claim 18, wherein:
   the second diode structure includes two horizontal diode junctions formed by two respective pairs of doped regions located beneath the first diode structure in the semiconductor device layer,
   constant currents are supplied to both horizontal diode junctions, and
   voltages across both horizontal diode junctions are measured to determine a differential voltage between the two horizontal diode junctions.

20. The method of claim 19, wherein the two horizontal diode junctions are supplied with equal constant currents.

* * * * *